(12) United States Patent
Wang et al.

(10) Patent No.: US 10,325,946 B2
(45) Date of Patent: Jun. 18, 2019

(54) PACKAGING METHOD AND PACKAGE STRUCTURE FOR IMAGE SENSING CHIP

(71) Applicant: China Wafer Level CSP Co., Ltd., Suzhou, Jiangsu (CN)

(72) Inventors: Zhiqi Wang, Suzhou (CN); Zhuowei Wang, Jiangsu (CN); Guoliang Xie, Jiangsu (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 15/765,968

(22) PCT Filed: Sep. 28, 2016

(86) PCT No.: PCT/CN2016/100559
§ 371 (c)(1),
(2) Date: Apr. 4, 2018

(87) PCT Pub. No.: WO2017/059777
PCT Pub. Date: Apr. 13, 2017

(65) Prior Publication Data
US 2018/0286903 A1   Oct. 4, 2018

(30) Foreign Application Priority Data

Oct. 10, 2015   (CN) .......................... 2015 1 0649774
Oct. 10, 2015   (CN) ..................... 2015 2 0780060 U

(51) Int. Cl.
*H01L 27/146*     (2006.01)
*H01L 23/00*      (2006.01)
(Continued)

(52) U.S. Cl.
CPC ........ *H01L 27/14618* (2013.01); *H01L 21/50* (2013.01); *H01L 23/13* (2013.01);
(Continued)

(58) Field of Classification Search
None
See application file for complete search history.

(56) References Cited

U.S. PATENT DOCUMENTS

2009/0284628 A1   11/2009   Wu et al.
2010/0133640 A1    6/2010   Wang et al.
(Continued)

FOREIGN PATENT DOCUMENTS

CN   101419952 A   4/2009
CN   101800207 A   8/2010
(Continued)

OTHER PUBLICATIONS

International Search Report for Application No. PCT/CN2016/100559 dated Jan. 4, 2017.

*Primary Examiner* — Matthew C Landau
*Assistant Examiner* — Grant S Withers
(74) *Attorney, Agent, or Firm* — Wolf, Greenfield & Sacks, P.C.

(57) ABSTRACT

A packaging method and a package for an image sensing chip are provided. The packaging method includes: providing a wafer including a first surface and a second surface opposite to the first surface, where the wafer has multiple image sensing chips arranged in a grid, each of the image sensing chips has an image sensing region and contact pads arranged on a side of the first surface; forming an opening corresponding to each of the contact pads and cutting trenches on a side of the second surface of the wafer, where the contact pad is exposed through the opening; filling the cutting trenches with a first photosensitive ink; and applying a second photosensitive ink on the second surface of the wafer to cover the opening with the second photosensitive ink and form a hollow cavity in the opening.

15 Claims, 14 Drawing Sheets

(51) Int. Cl.
  *H01L 23/13* (2006.01)
  *H01L 23/31* (2006.01)
  *H01L 23/49* (2006.01)
  *H01L 23/492* (2006.01)
  *H01L 21/50* (2006.01)

(52) U.S. Cl.
  CPC .............. *H01L 23/31* (2013.01); *H01L 23/49* (2013.01); *H01L 23/492* (2013.01); *H01L 24/03* (2013.01); *H01L 24/11* (2013.01); *H01L 24/13* (2013.01); *H01L 27/14632* (2013.01); *H01L 27/14636* (2013.01); *H01L 27/14638* (2013.01); *H01L 27/14687* (2013.01); *H01L 2224/02371* (2013.01); *H01L 2224/02372* (2013.01); *H01L 2224/02381* (2013.01); *H01L 2224/0382* (2013.01); *H01L 2224/10145* (2013.01); *H01L 2224/11* (2013.01); *H01L 2224/11019* (2013.01); *H01L 2224/13024* (2013.01)

(56) References Cited

U.S. PATENT DOCUMENTS

| | | | |
|---|---|---|---|
| 2011/0169139 A1* | 7/2011 | Lin | H01L 23/481 257/621 |
| 2011/0169159 A1* | 7/2011 | Lin | H01L 21/481 257/692 |
| 2012/0205799 A1* | 8/2012 | Lin | H01L 21/76898 257/737 |
| 2015/0206916 A1* | 7/2015 | Lee | H01L 27/14632 257/433 |
| 2016/0043123 A1* | 2/2016 | Chien | H01L 27/14632 257/432 |
| 2016/0284751 A1* | 9/2016 | Ho | H01L 23/3114 |

FOREIGN PATENT DOCUMENTS

| | | |
|---|---|---|
| CN | 105226036 A | 1/2016 |
| CN | 205050839 U | 2/2016 |

* cited by examiner

PACKAGING METHOD AND PACKAGE STRUCTURE FOR IMAGE SENSING CHIP

The present application is the national phase of International Patent Application No. PCT/CN2016/100559, filed on Sep. 28, 2016, which claims priority to Chinese Invention Patent Application No. 201510649774.1, titled "PACKAGING METHOD AND PACKAGE STRUCTURE FOR IMAGE SENSING CHIP" and filed with the Chinese State Intellectual Property Office on Oct. 10, 2015, and priority to Chinese Utility Model Patent Application No. 201520780060.X, titled "IMAGE SENSING CHIP PACKAGE" and filed with the Chinese State Intellectual Property Office on Oct. 10, 2015, all of which applications are incorporated herein by reference in their entireties.

FIELD

The present disclosure relates to the technical field of semiconductors, and in particular to a packaging method for a wafer level semiconductor chip and a package thereof.

BACKGROUND

Currently, the wafer level chip size packaging (WLCSP) technology is the mainstream semiconductor chip packaging technology, in which a full wafer is packaged and tested, and then is cut to acquire individual finished chips. By using this packaging technology, the individual packaged chip product almost has the same size as an individual crystalline grain, which meets the market requirement for lighter, smaller, shorter, thinner and cheaper microelectronic products. The wafer level chip size packaging technology is a hotspot in the current packaging field, and represents a development trend in the future.

SUMMARY

An image sensing chip packaging method is provided according to the present disclosure, with which the reliability of an image sensing chip package can be improved. The image sensing chip packaging method includes:
providing a wafer including a first surface and a second surface opposite to the first surface, where the wafer has multiple image sensing chips arranged in a grid, and each of the image sensing chips has an image sensing region and contact pads arranged on a side of the first surface;
forming an opening corresponding to each of the contact pads and cutting trenches on a side of the second surface of the wafer, where the contact pad is exposed through the opening;
filling the cutting trenches with a first photosensitive ink; and
applying a second photosensitive ink on the second surface of the wafer to cover the opening with the second photosensitive ink and form a hollow cavity in the opening.

Optionally, the filling the cutting trenches with the first photosensitive ink may include:
applying the first photosensitive ink on the second surface of the wafer to fill the cutting trenches with the first photosensitive ink; and
removing the first photosensitive ink outside the area of the cutting trench by an exposing and developing process.

Optionally, the cutting trenches may be filled with the first photosensitive ink by a spin-coating process, the second surface may be coated with the second photosensitive ink by a spin-coating process, and a spin-coating rate for the first photosensitive ink is less than a spin-coating rate for the second photosensitive ink.

Optionally, a viscosity of the first photosensitive ink may be less than a viscosity of the second photosensitive ink Optionally, the viscosity of the first photosensitive ink may be less than 8 Kcps, and the viscosity of the second photosensitive ink may be greater than 12 Kcps.

Optionally, before forming the cutting trenches and the opening on the second surface of the wafer, the image sensing chip packaging method may further include:
providing a protective substrate, where the protective substrate has support units arranged in a grid, and each of the support units corresponds to one of the image sensing chips;
aligning and laminating the first surface of the wafer with the protective substrate, with the support units being between the wafer and the protective substrate; and
grinding and thinning the wafer on the second surface.

Optionally, forming the cutting trenches and the opening on the second surface of the wafer may include:
forming, pre-cutting trenches and the opening on the second surface of the wafer in a same etching process; and
cutting along the pre-cutting trenches with a cutter, through the first surface of the wafer to form the cutting trenches.

Optionally, before applying the second photosensitive ink, the image sensing chip packaging method may further include:
forming an insulating layer on a sidewall of the opening;
forming a rewiring layer on the insulating layer and at the bottom of the opening, where the rewiring layer is electrically connected to the contact pad;
applying the second photosensitive ink on the second surface of the wafer by a screen-printing process to form multiple through holes on the second photosensitive ink, where the rewiring layer is exposed through the through holes; and
forming a solder ball in each of the through holes, where the solder ball is electrically connected to the rewiring layer.

Optionally, before applying the second photosensitive ink, the image sensing chip packaging method may further include:
forming an insulating layer on a sidewall of the opening;
forming a rewiring layer on the insulating layer and at the bottom of the opening, where the rewiring layer is electrically connected to the contact pad;
applying the second photosensitive ink on the entire second surface of the wafer by a spin-coating process;
forming multiple through holes on the second photosensitive ink by an exposing and developing process, where the rewiring layer is exposed through the through holes; and
forming a solder ball in each of the through holes, where the solder ball is electrically connected to the rewiring layer.

An image sensing chip package is further provided according to the present disclosure. The image sensing chip package includes:
a substrate including a first surface and a second surface opposite to the first surface;
an image sensing region and contact pads, arranged on a side of the first surface of the substrate;
openings arranged on a side of the second surface and extending towards the first surface, where each of the contact pads corresponds to one of the openings and is exposed through the opening;
a first photosensitive ink covering a sidewall of the substrate; and a second photosensitive ink covering the openings and forming a hollow cavity in each of the openings.

Optionally, the package may further include:

a protective substrate aligned and laminated with the first surface of the substrate; and a support unit arranged between the protective substrate and the substrate, and enclosing the image sensing region; where the first photosensitive ink covers a portion of a sidewall of the support unit.

Optionally, a viscosity of the first photosensitive ink may be less than a viscosity of the second photosensitive ink.

Optionally, the viscosity of the first photosensitive ink may be less than 8 Kcps, and the viscosity of the second photosensitive ink may be greater than 12 Kcps.

Optionally, the package may further include:

an insulating layer arranged on a sidewall of each of the openings; and a rewiring layer on the insulating layer and at the bottom of the opening, where the rewiring layer is electrically connected to the contact pad, where the second photosensitive ink covers the rewiring layer and is provided with through holes through which the rewiring layer is exposed; and a solder ball is arranged in each of the through holes and is electrically connected to the rewiring layer.

According to the package of the present disclosure, the hollow cavity is formed in the opening, so that the rewiring layer is effectively prevented from being detached from the contact pad, thereby improving the image sensing chip package yield, and improving the reliability of a package for the image sensing chip.

DETAILED DESCRIPTION OF EMBODIMENTS

Specific embodiments of the present disclosure are described below in detail in conjunction with the drawings. The embodiments are not intended to limit the present disclosure, and any modification in structures, methods or functions made by those skilled in the art according to these embodiments fall within the protection scope of the present disclosure.

Figure 1:
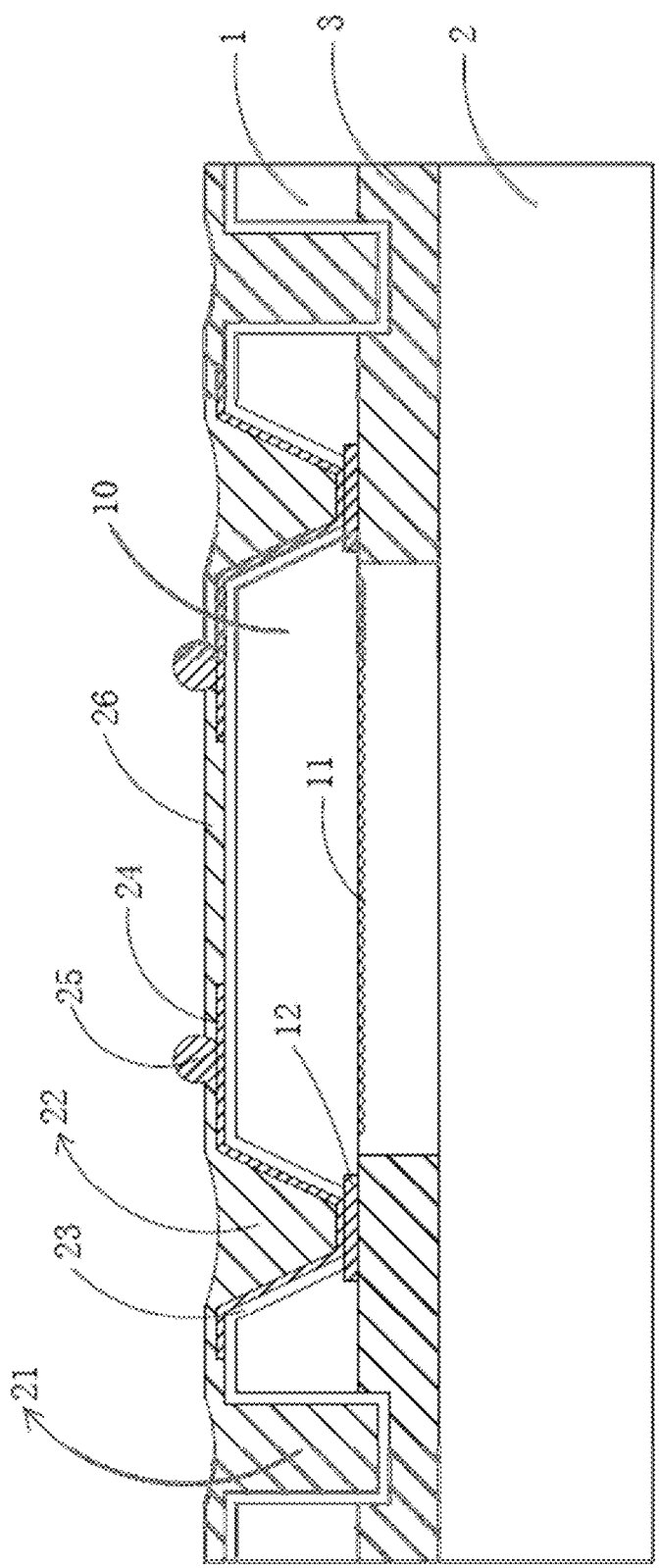
FIG. 1 is a schematic diagram of a wafer level image sensing chip package.

Reference is made to FIG. 1, which shows a wafer level image sensing chip package. A wafer 1 is aligned and laminated with a protective substrate 2. Support units 3 are arranged between the wafer 1 and the protective substrate 2 to form a gap between the wafer 1 and the protective substrate 2, so as to prevent the protective substrate 2 from directly contacting with the wafer 1. The wafer 1 includes multiple image sensing chips 10 arranged in a grid. Each image sensing chip 10 includes an image sensing region 11 and contact pads 12. The multiple support units 3 are arranged in a grid on the protective substrate 2, and correspond to the image sensing chips 10. After the protective substrate 2 is aligned and laminated with the wafer 1, the support units 3 enclose the image sensing region 11. The wafer 1 has a first surface and a second surface opposite the first surface. The image sensing region 11 and the contact pads 12 are arranged on the side of the first surface of the wafer.

In order to realize electrical connection between the contact pad 12 and other circuits, an opening 22 extending towards the first surface is provided on the side of the second surface of the wafer 1. The opening 22 corresponds to the contact pad 12, and the contact pad 12 is exposed from the bottom of the opening 22. An insulating layer 23 is arranged on a sidewall of the opening 22. A rewiring layer 24 is arranged on the insulating layer 23 and at the bottom of the opening 22. The rewiring layer 24 is electrically connected to the contact pad 12. Solder balls 25 are electrically connected to the rewiring layer 24. The electrical connection between the contact pad 12 and other circuits is realized by electrically connecting the solder balls 25 to the other circuits.

The second surface of the wafer 1 is provided with a cutting trench 21 extending towards the first surface, in order to facilitate cutting off the packaged image sensing chip.

Before the solder ball 25 is arranged on the second surface of the wafer 1, solder mask ink 26 is required to be applied on the second surface. Normally the cutting trench 21 and the opening 22 are also filled with the solder mask ink 26 for the purpose of protection and insulation.

However, when the opening 22 is completely filled with the solder mask ink 26, the solder mask ink completely contacts with the rewiring layer. In the subsequent reflow soldering and reliability testing, a stress generated by the thermal expansion and contraction of the solder mask ink 26 is applied to the rewiring layer 24, and the rewiring layer 24 is easily detached from the contact pad 12 under the stress, which results in defective product.

Therefore, in an embodiment of the present disclosure, a hollow cavity is formed in the opening, so that the solder mask ink does not contact with the wiring layer at the bottom of the opening, thereby effectively preventing the rewiring layer from being detached from the contact pad.

Figure 2:
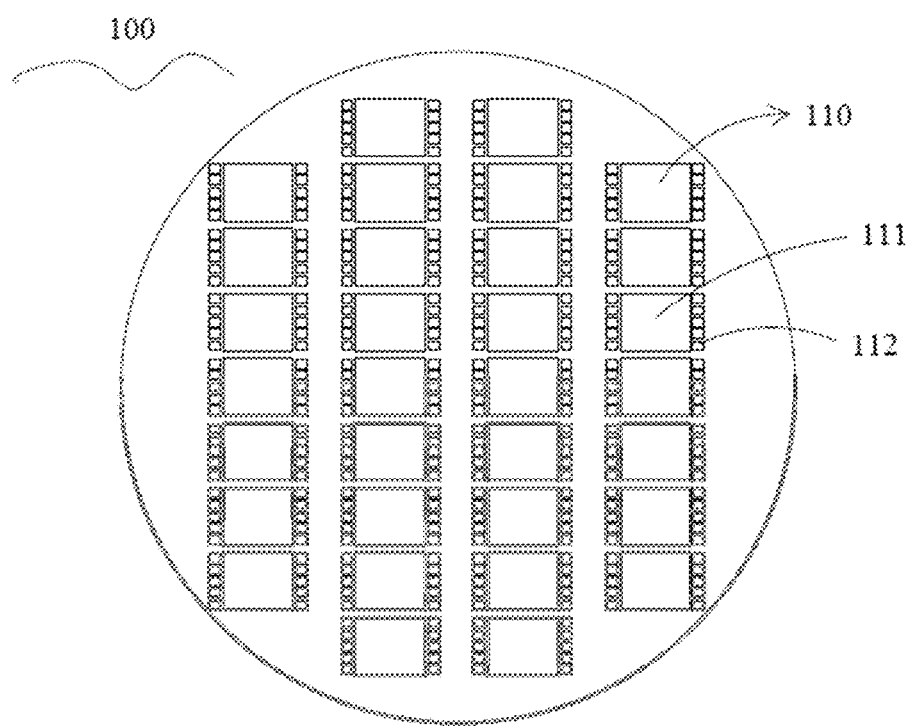
FIG. 2 is a schematic diagram showing a structure of a wafer level image sensing chip.

Reference is made to FIG. 2, which is a schematic diagram showing a structure of a wafer level image sensing chip. A wafer 100 has multiple image sensing chips 110 arranged in a gird. Gaps are reserved between the image sensing chips 110. After the packaging process and the testing are completed, the image sensing chips are separated along the gaps.

Each image sensing chip 110 has an image sensing region 111 and multiple contact pads 112 arranged at periphery of the image sensing region 111. The contact pad 112 and the image sensing region 111 are arranged on a side of the same surface of the wafer 100.

Figure 3:
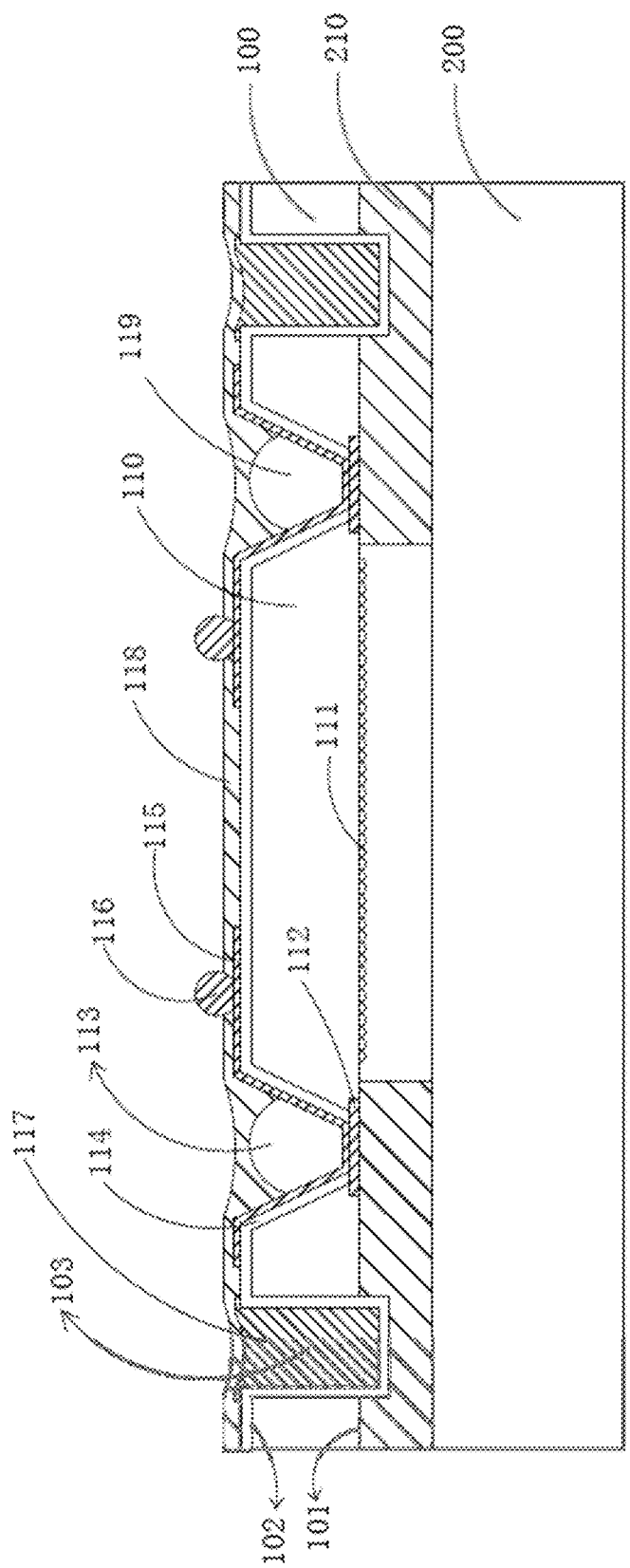
FIG. 3 is a schematic cross-sectional view of a wafer level image sensing chip package according to an embodiment of the present disclosure.

Reference is made to FIG. 3, which is a schematic cross-sectional view of a wafer level image sensing chip package according to an embodiment of the present disclosure. Multiple support units 210 are arranged in a grid on one side of a protective substrate 200. After the wafer 100 is aligned and laminated with the protective substrate 200, the support units 210 are between the wafer 100 and the protective substrate 200 to form a gap between the wafer 100 and the protective substrate 200. The support units 210 correspond to the image sensing chips 110 in a one-to-one correspondence, and the support units 210 enclose the image sensing region 111.

The wafer 100 has a first surface 101 and a second surface 102 opposite to the first surface 101. The image sensing region 111 and the contact pads 112 are arranged on the side of the first surface 101. The second surface 102 of the wafer is provided with cutting trenches 103 and openings 113 extending towards the first surface 101. Each opening 113 corresponds to one contact pad 112 in terms of position, and the contact pad 112 is exposed from the bottom of the opening 113.

A rewiring layer 115 and solder balls 116 are used to facilitate connection between the contact pads 112 and other circuits. In an embodiment, an insulating layer 114 is formed on a sidewall of the opening 113 and on the second surface 102 of the wafer 100. The rewiring layer 115 is formed on the insulating layer 114 and at the bottom of the opening 113. The rewiring layer 115 is electrically connected to the contact pad 112. The solder ball 116 is arranged on the second surface 102 of the wafer 100. The solder ball 116 is electrically connected to the rewiring layer 115. The electrical connection between the contact pad 112 and other circuits is realized by electrically connecting the solder ball 116 to the other circuit.

The cutting trench 103 is filled with a first photosensitive ink 117. A second photosensitive ink 118 covers the opening 113, and forms a hollow cavity 119 in the opening 113. The second photosensitive ink 118 has through holes through which the rewiring layer 115 is exposed. The solder balls 116 are arranged in the through holes and electrically connected to the rewiring layer 115.

In this embodiment, referring to FIG. 3, the first photosensitive ink 117 partly overflows from the cutting trench 103. Apparently, it is not limited in the embodiment that the cutting trench 103 is completely filled with the first photosensitive ink 117, or the first photosensitive ink 117 overflows from the cutting trench 103, or the lower portion of the cutting trench 103 is filled with the first photosensitive ink 117 and the upper portion of the cutting trench 103 is filled with the second photosensitive ink 118 and covered by the second photosensitive ink 118. In the embodiment of the present disclosure, the cutting trench being filled with the first photosensitive ink should be understood as that the first photosensitive ink fills at least the lower portion of the cutting trench, and does not have to filling up or overflowing from the cutting trench.

A specific packaging process of forming the hollow cavity 119 in the opening 113 is described as follows.

The wafer 100 is provided, referring to FIG. 1 for the structural diagram of the wafer 100.

The protective substrate 200 is provided, and the multiple support units 210 are arranged in a grid on one side of the protective substrate 200. In this embodiment, the support units 210 are made of photosensitive ink and formed on one side of the protective substrate 200 by an exposing and developing process.

Figure 4:
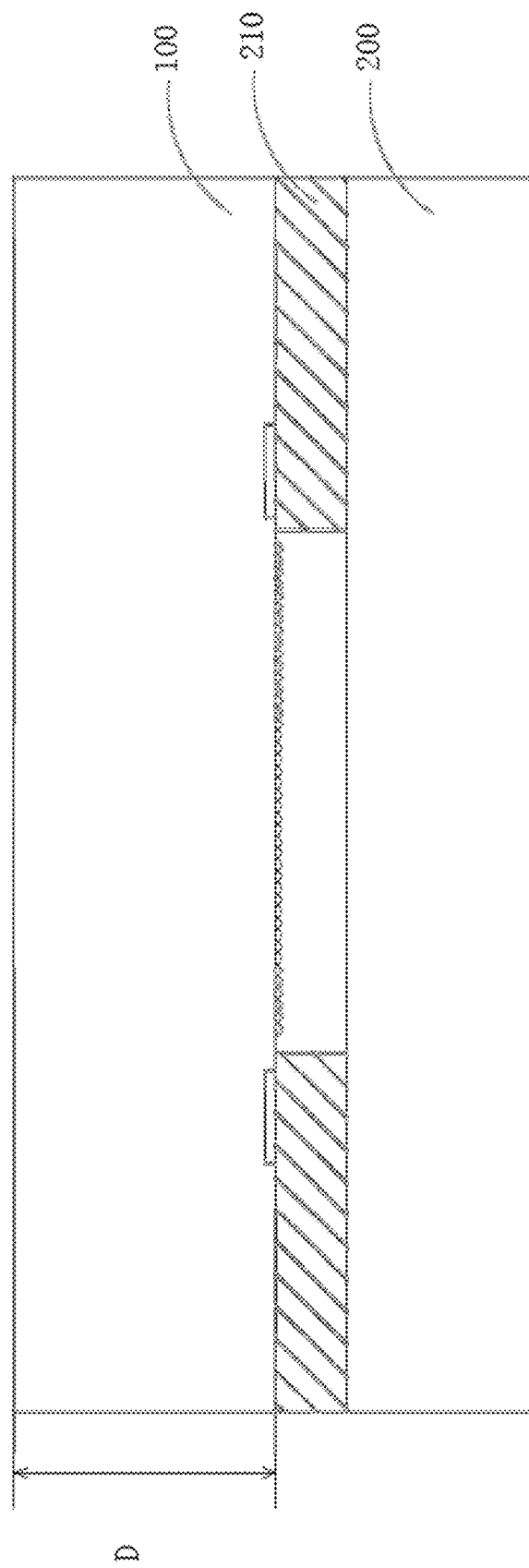
FIGS. 4 to 12 are schematic diagrams illustrating a wafer level image sensing chip packaging method according to an embodiment of the present disclosure.

Referring to FIG. 4, the wafer 100 is aligned and laminated with the protective substrate 200, and the wafer 100 is bonded to the protective substrate 200 with an adhesive. The support unit 210 is between the wafer 100 and the protective substrate 200. Multiple sealed spaces are formed in a grid by the enclosure of the support unit 210, the wafer 100 and the protective substrate 200. Each of the sealed spaces corresponds to one image sensing chip 110. The support unit 210 encloses the image sensing region 111 of the image sensing chip 110.

Figure 5:
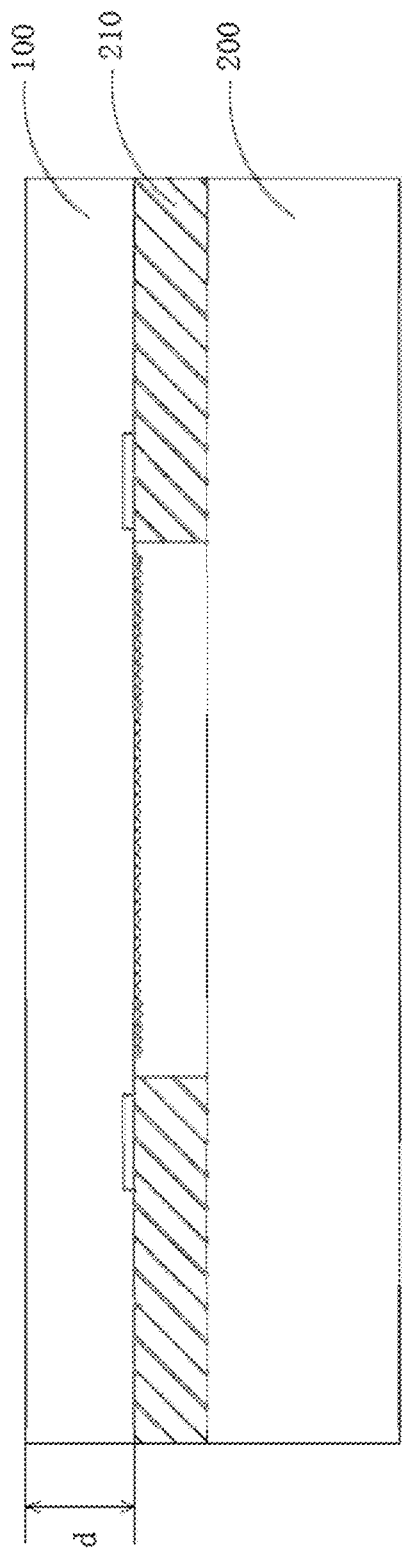

Referring to FIG. 5, the wafer 100 is grinded and thinned on the second surface 102. A thickness of the wafer 100 before thinning is denoted as D, and a thickness of the wafer 100 after thinning is denoted as d.

Figure 6:
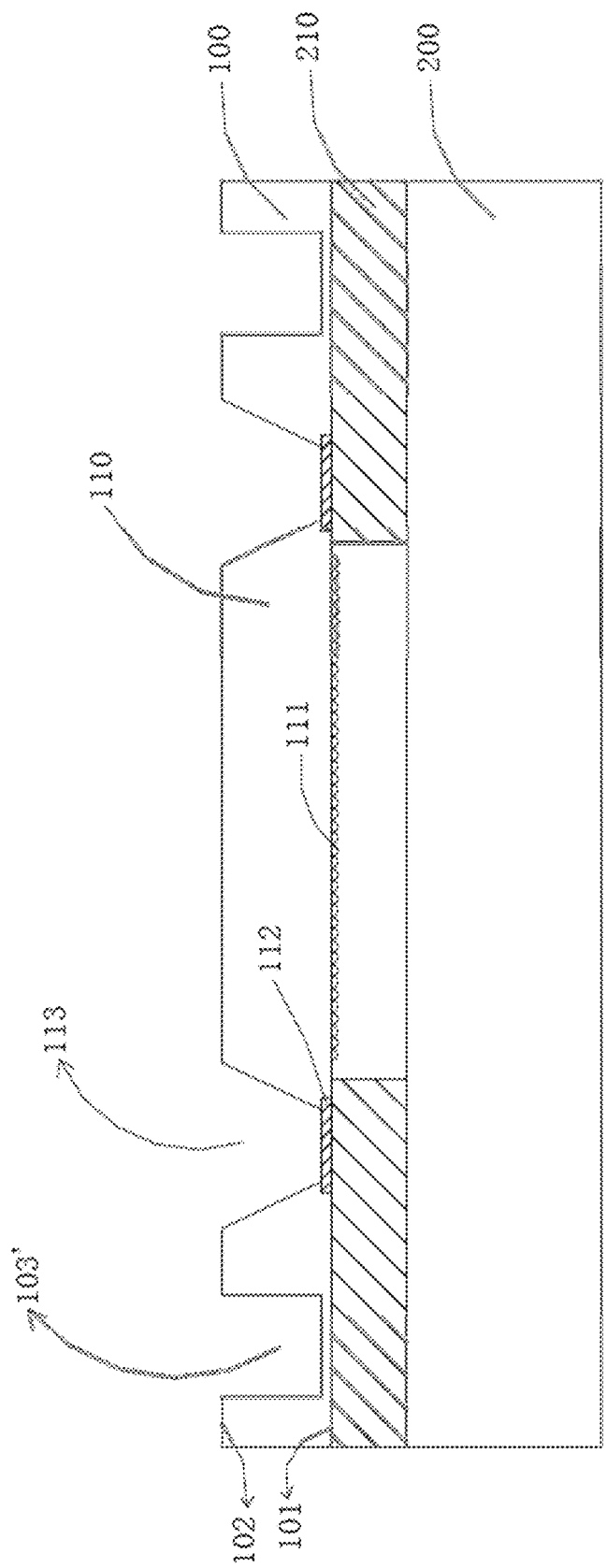

Referring to FIG. 6, pre-cutting trenches 103' and the openings 113 extending towards the first surface 101 of the wafer 100 are etched on the second surface 102 of the wafer 100 by an etching process. The contact pad 112 is exposed from the bottom of the opening 113. In this embodiment, a depth of the pre-cutting trench 103' is the same as a depth of the opening 113. Apparently, this step may include etching only the opening 113 without the pre-cutting trench 103'.

Figure 7:
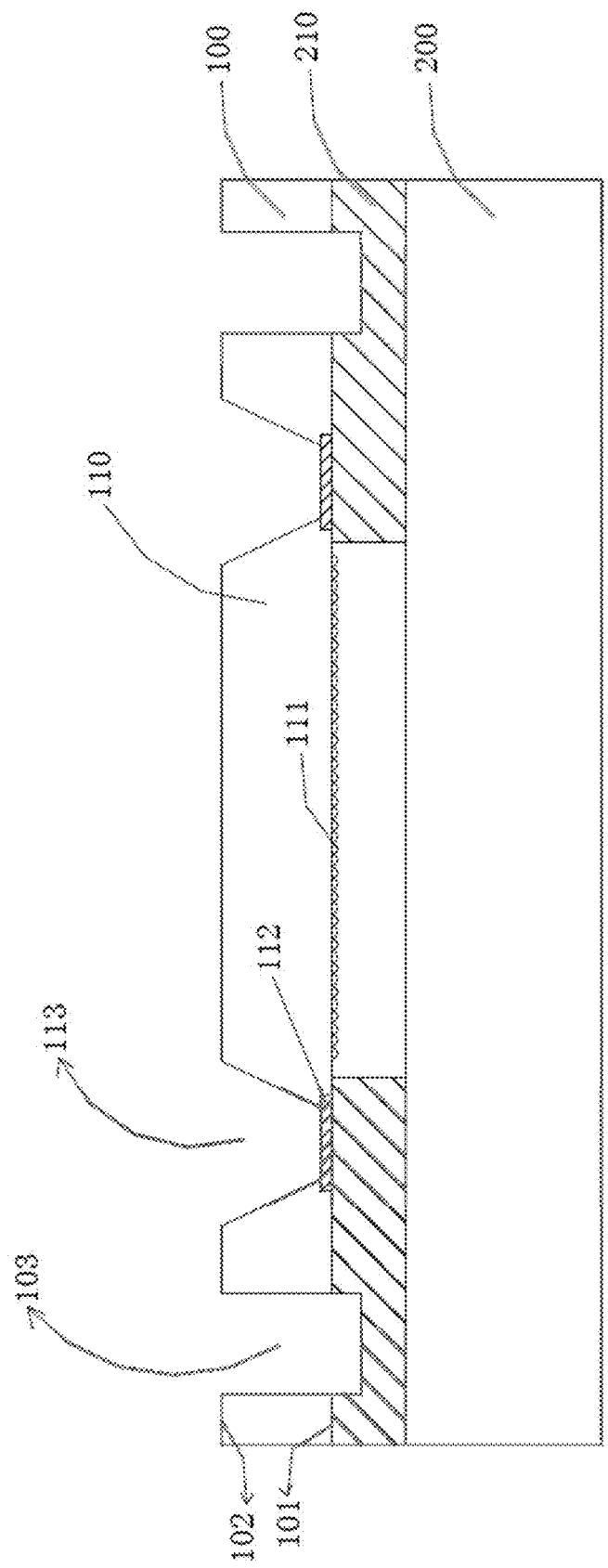

Referring to FIG. 7, a cutter is used to cut from the second surface 102 of the wafer 100 towards the first surface 101 along the pre-cutting trench 103' until the first surface 101 of the wafer 100 is cut through to form the cutting trench 103, that is, the cutter cuts into a portion of the support unit 210. Since the material of the wafer 100 is brittle and has poor toughness and ductility, the cutter is selected to have a high hardness, such as a metal knife.

Figure 8A:
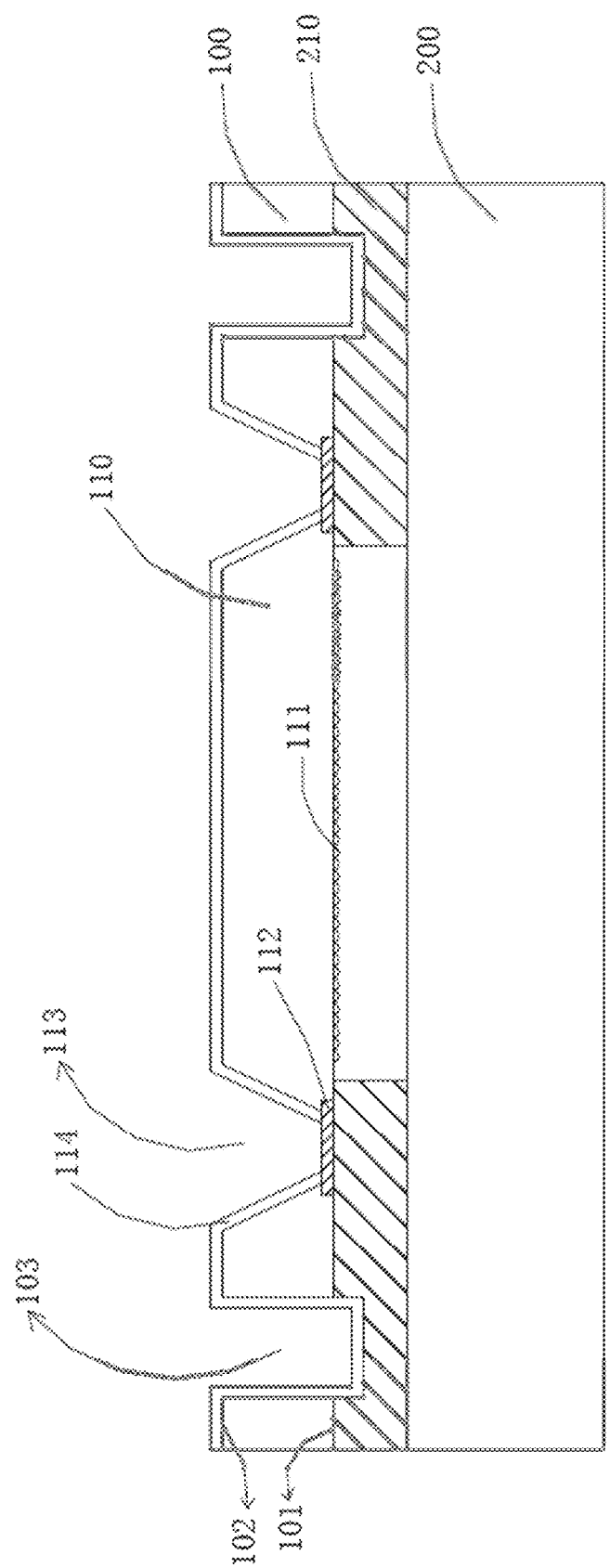
Figure 8B:
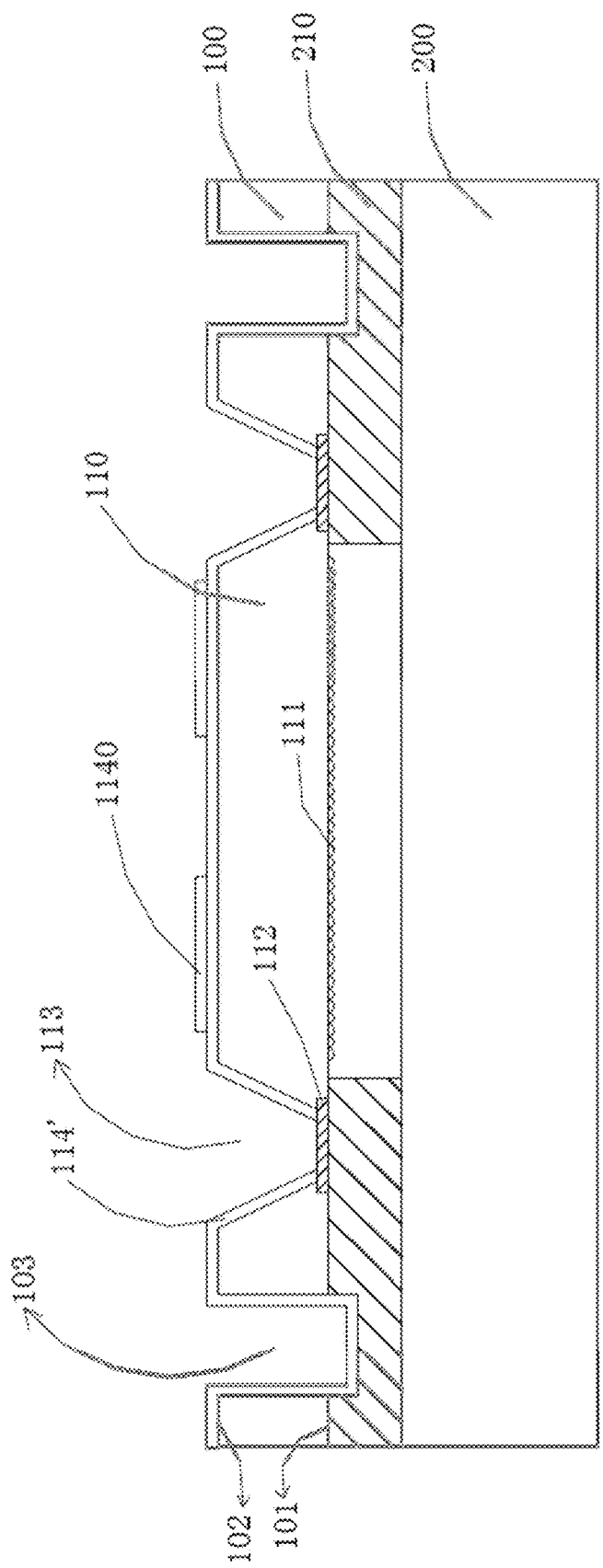

Referring to FIG. 8(*a*), the insulating layer 114 is formed on the second surface 102 of the wafer 100, on a sidewall of the opening 113, at the bottom of the opening 113, and on an inner wall of the cutting trench 103. In this embodiment, the insulating layer 114 is made of an organic insulating material, thereby having insulativity and flexibility. The insulating layer 114 is formed by a spraying or spin-coating process, and then the contact pad 112 is exposed by means of laser or by an exposing and developing process.

Referring to FIG. 8(*b*), an insulating layer 114' may also be deposited on the second surface 102 of the wafer 100, on the sidewall of the opening 113, at the bottom of the opening 113, and on the inner wall of the cutting trench 103. The insulating layer 114' is made of an inorganic material, which normally is silicon dioxide. Since impact resistance of the silicon dioxide is not as good as that of the organic insulating material 114, a buffer layer 1140 is formed on the second surface of the wafer 101 by an exposing and developing process to facilitate subsequent solder ball bonding. Then the insulating layer at the bottom of the opening 113 is etched off by an etching process to expose the contact pad 112.

Figure 9:
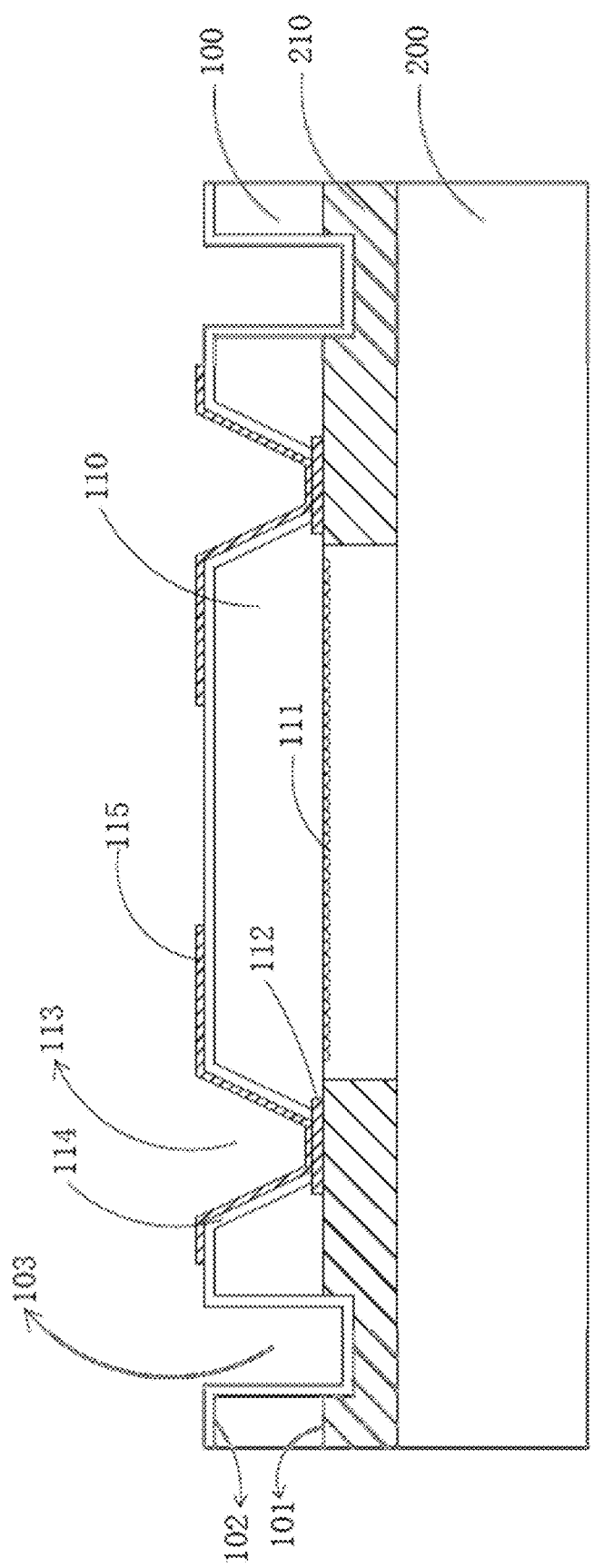

Referring to FIG. 9, the rewiring layer 115 is formed on the insulating layer 114 (or the insulating layer 114'), and the rewiring layer 115 is electrically connected to the contact pad 112.

The key of the embodiment of the present disclosure is that, the cutting trench 103 is filled with the photosensitive ink, and the hollow cavity 119 is formed in the opening 113 so that the photosensitive ink does not contact the bottom of the opening 113 to prevent the opening 113 from being completely filled with the photosensitive ink.

Figure 10:
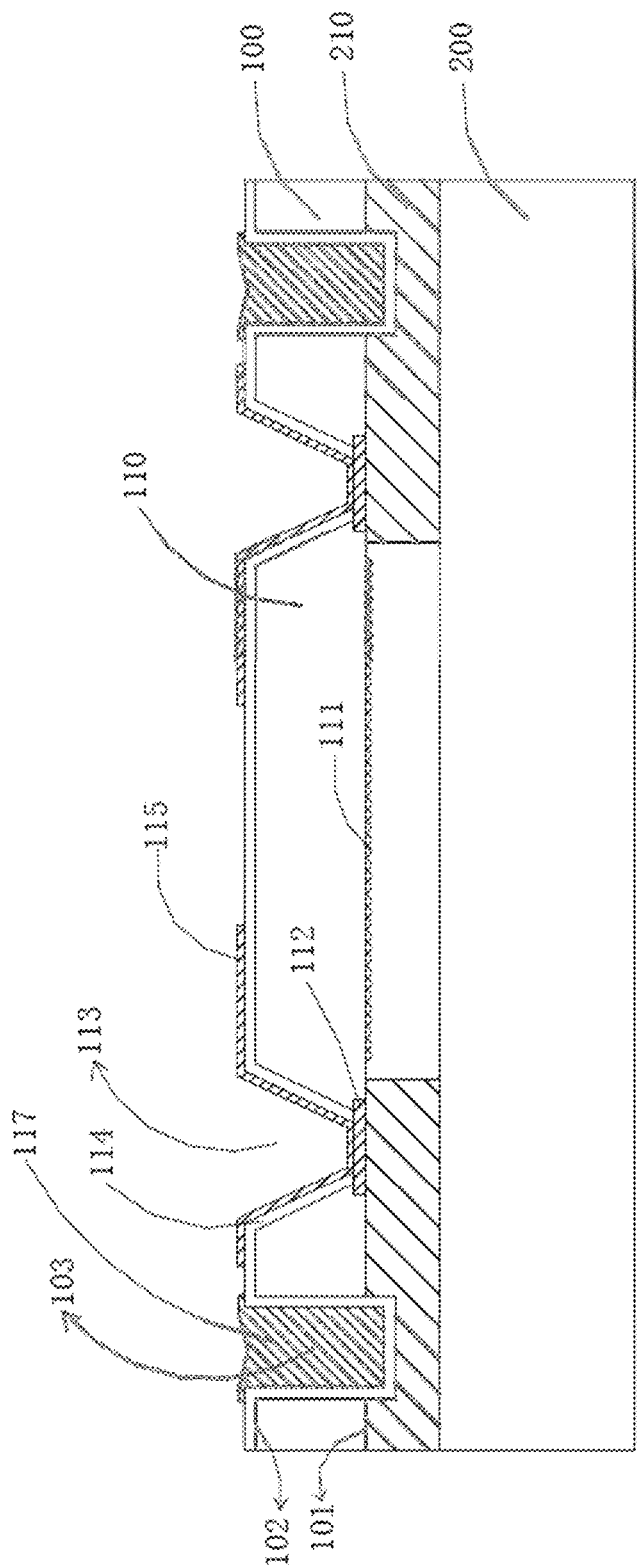

Specifically, referring to FIG. 10, the cutting trench 103 is filled with the first photosensitive ink 117. In this embodiment, the entire second surface 102 of the wafer 100 is coated with the first photosensitive ink 117 by a spin-coating process, and then the first photosensitive ink 117 outside the area of the cutting trench 103 is removed by an exposing and developing process.

In order to ensure that at least the lower portion of the cutting trench 103 is filled with the first photosensitive ink 117, a photosensitive ink with a low viscosity may be used or a spin-coating rate in the spin-coating process may be reduced, so that the bottom of the cutting trench 103 is sufficiently filled with the first photosensitive ink. A viscosity of the photosensitive ink may be reduced by adding a thinner agent. In an implementation, a viscosity of the first photosensitive ink 117 is less than 8 Kcps.

Figure 11:
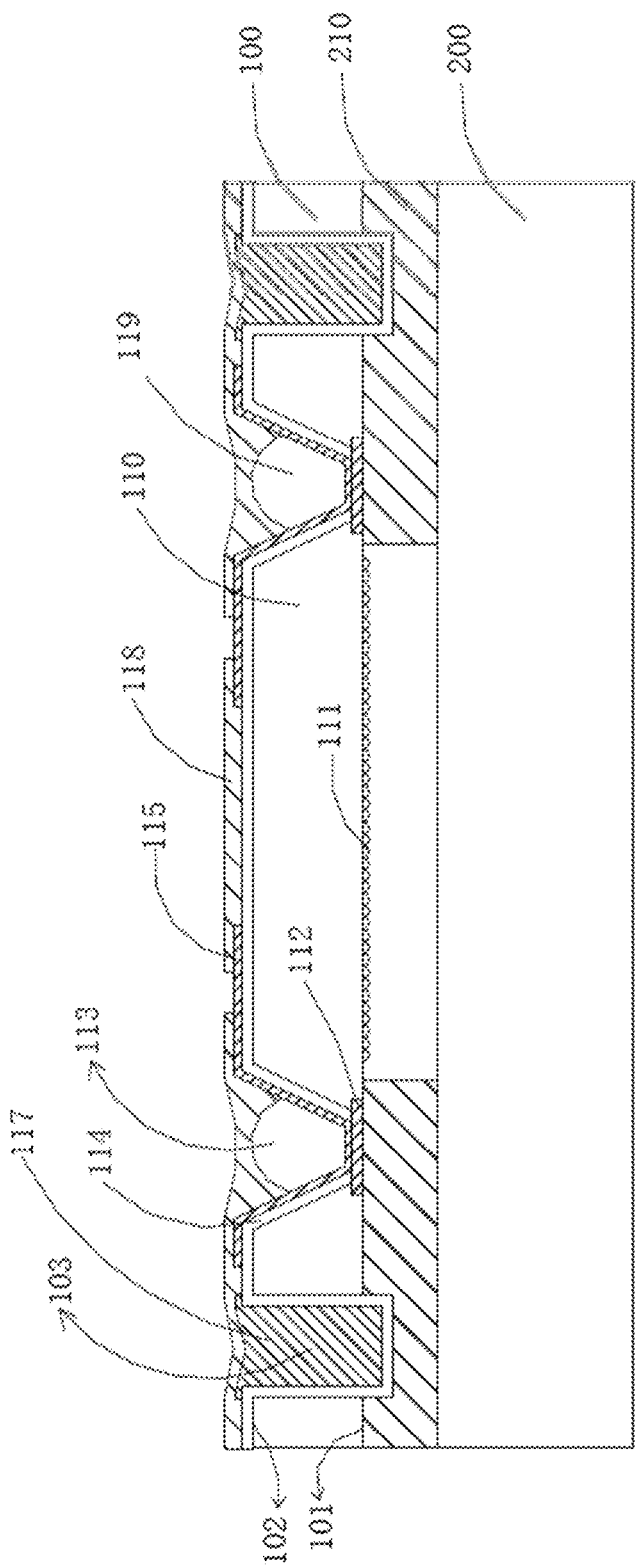

Referring to FIG. 11, the second photosensitive ink 118 is applied on the second surface 102 of the wafer 100, to make the second photosensitive ink 118 cover the opening 113 and form the hollow cavity 119 in the opening 113. A solder mask is formed by the second photosensitive ink 118, to provide a solder resist function so as to protect the chip in the subsequent solder ball bonding process.

In order to ensure that the hollow cavity 119 is formed in the opening 113, a photosensitive ink with a high viscosity may be used or a spin-coating rate for the second photosensitive ink 118 may be increased, so that the second photosensitive ink 118 does not fill the bottom of the opening 113 but covers only the upper portion of the opening 113. In an implementation, a viscosity of the second photosensitive ink 118 is greater than 12 Kcps.

In an implementation, the spin-coating rate for the first photosensitive ink 117 is less than the spin-coating rate for the second photosensitive ink 118.

In an implementation, the viscosity of the first photosensitive ink 117 is less than the viscosity of the second photosensitive ink 118.

In order to facilitate the subsequent solder ball bonding, a through hole is formed on the second photosensitive ink 118 at a position corresponding to the rewiring layer 115. Specifically, the through hole exposing the rewiring layer 115 may be formed by a curing process and an exposing and developing process after the second photosensitive ink 118 is applied on the entire second surface 102 of the wafer 100. Apparently, the through hole exposing the rewiring layer 115 may be formed by applying the second photosensitive ink 118 on the second surface 102 of the wafer 100 by a screen-printing process.

Figure 12:
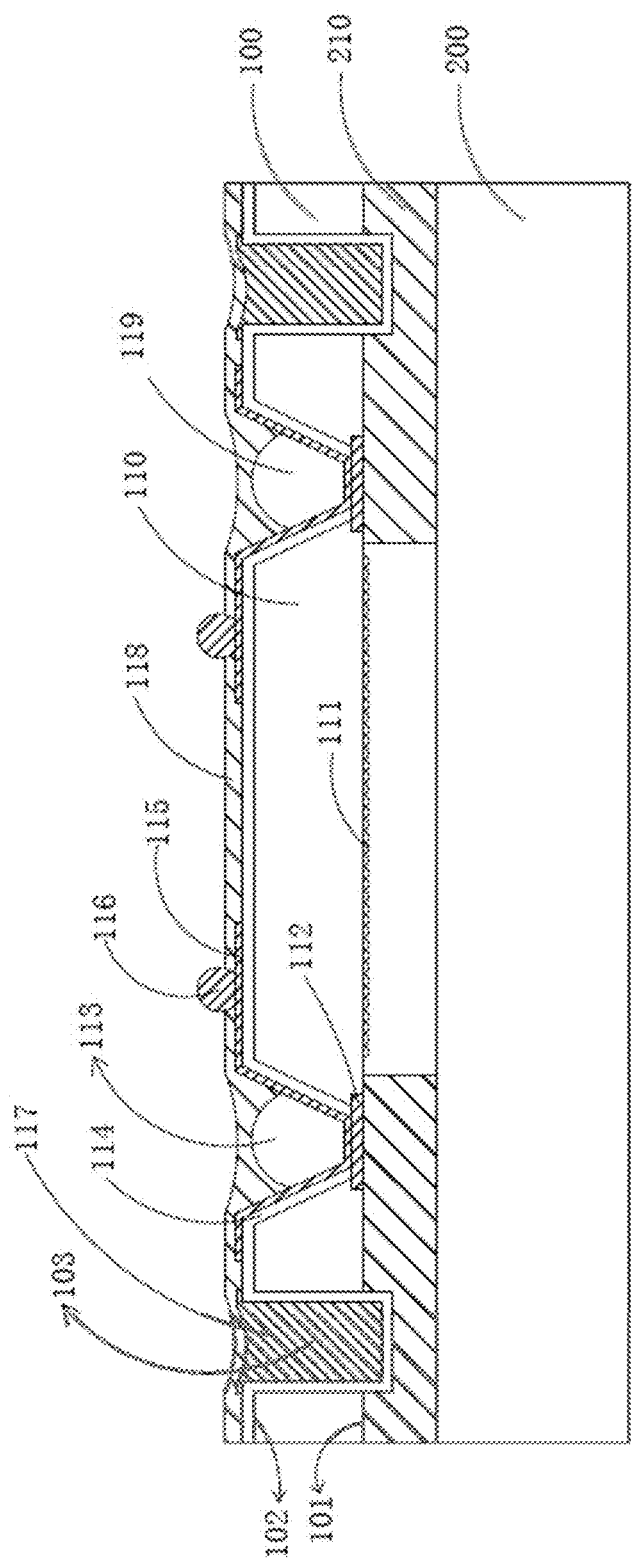

Referring to FIG. 12, the solder ball 116 is formed in the through hole by a solder ball bonding process, such that the solder ball 116 is electrically connected to the rewiring layer.

Finally, the wafer 100 and the protective substrate 200 are cut from the second surface 102 of the wafer 100 towards the first surface 101 of the wafer 100 along the cutting trench 103 to acquire individual image sensing chip packages.

Figure 13:
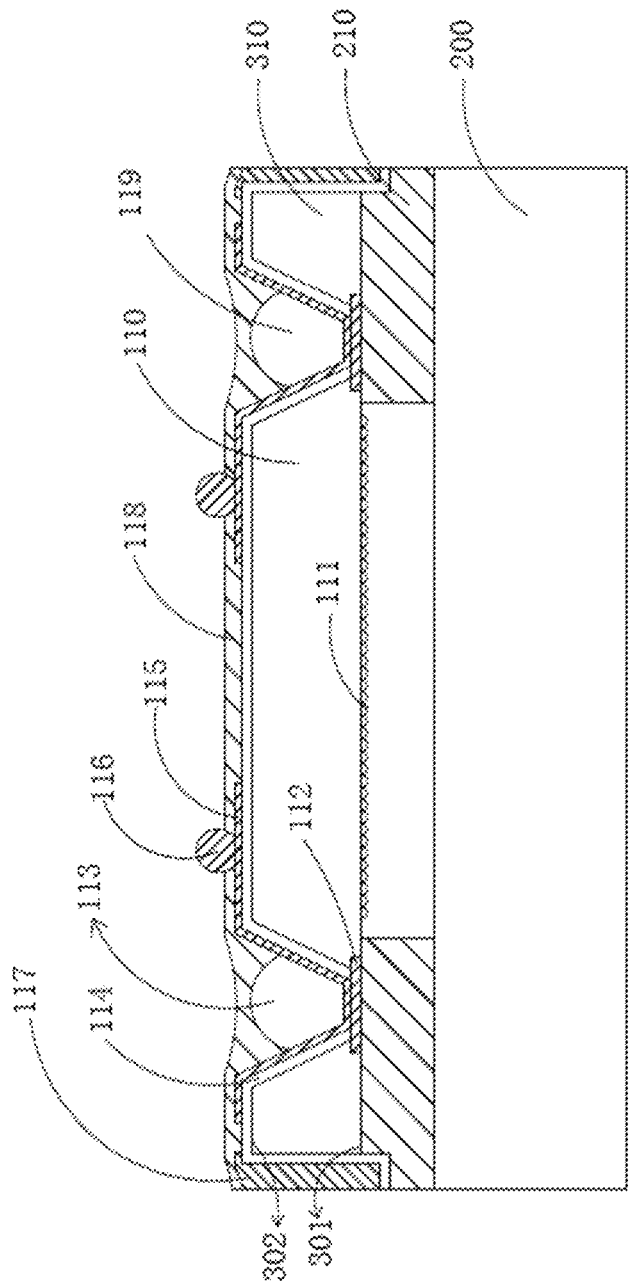
FIG. 13 is a schematic diagram showing a package for an individual image sensing chip according to an embodiment of the present disclosure.

Referring to FIG. 13, the individual image sensing chip package 300 includes a substrate 310 cut from the wafer 100. The substrate 310 has a first surface 301 and a second surface 302 opposite to the first surface 301. The image sensing region 111 and the contact pad 112 are arranged on the side of the first surface 301. The opening 113 and the solder ball 116 are arranged on the side of the second surface 302. The sidewall of the substrate 310 are covered by a photosensitive ink.

In this embodiment, the sidewall of the substrate 310 is completely covered by the first photosensitive ink 117. Apparently, a portion of the sidewall of the substrate 310 near the second surface 302 may also be covered by the second photosensitive ink 118. That is, the first photosensitive ink 117 covers a portion of the sidewall of the support unit 210 and a portion of the sidewall of the substrate near the first surface 301, and the second photosensitive ink 118 covers a portion of the sidewall of the substrate near the second surface 302.

In a case where the insulating layer 114 is made of an organic insulating material, the buffer layer 1140 may not be arranged between the rewiring layer 115 and the insulating layer 114 at a position corresponding to the solder ball 116.

In a case where the insulating layer 114' is made of an inorganic material, the buffer layer 1140 is arranged between the rewiring layer 115 and the insulating layer 114 at the position corresponding to the solder ball 116. The buffer layer 1140 is made of a photoresist material and may be formed by an exposing and developing process.

It should be understood that, the description of the embodiments is made in the present specification, but each embodiment does not merely include one independent technical solution. The description manner of the specification is only for clarity. Those skilled in the art should take the specification as a whole. Technical solutions in the embodiments may be combined appropriately to form other embodiments understandable for those skilled in the art.

The detailed description above is made only for illustrating feasible embodiments of the present disclosure and is not intended to limit the protection scope of the present disclosure. Any equivalent implementations or changes made without departing from the technology and spirit of the present disclosure should be included in the protection scope of the present disclosure.

The invention claimed is:

1. An image sensing chip packaging method, comprising:
    providing a wafer comprising a first surface and a second surface opposite to the first surface, wherein the wafer has a plurality of image sensing chips arranged in a grid, each of the image sensing chips has an image sensing region and contact pads, the image sensing region and the contact pads are arranged on a side of the first surface;
    forming an opening corresponding to each of the contact pads and cutting trenches on a side of the second surface of the wafer, wherein the contact pad is exposed through the opening;
    filling the cutting trenches with a first photosensitive ink; and
    applying a second photosensitive ink on the second surface of the wafer to cover the opening with the second photosensitive ink and form a hollow cavity in the opening.

2. The image sensing chip packaging method according to claim 1, wherein the filling the cutting trenches with a first photosensitive ink comprises:
    applying the first photosensitive ink on the second surface of the wafer to fill the cutting trenches with the first photosensitive ink; and
    removing the first photosensitive ink outside the area of the cutting trenches by an exposing and developing process.

3. The image sensing chip packaging method according to claim 1, wherein
    the cutting trenches are filled with the first photosensitive ink by a spin-coating process,
    the second surface is coated with the second photosensitive ink by spin-coating, and
    a spin-coating rate for the first photosensitive ink is less than a spin-coating rate for the second photosensitive ink.

4. The image sensing chip packaging method according to claim 1, wherein a viscosity of the first photosensitive ink is less than a viscosity of the second photosensitive ink.

5. The image sensing chip packaging method according to claim 4, wherein the viscosity of the first photosensitive ink is less than 8 Kcps, and the viscosity of the second photosensitive ink is greater than 12 Kcps.

6. The image sensing chip packaging method according to claim 1, wherein before forming the cutting trenches and the opening on the second surface of the wafer, the image sensing chip packaging method further comprises:

providing a protective substrate, wherein the protective substrate has support units arranged in a grid, and each of the support units corresponds to one of the image sensing chips;

aligning and laminating the first surface of the wafer with the protective substrate, with the support units being between the wafer and the protective substrate; and grinding and thinning the wafer on the second surface.

7. The image sensing chip packaging method according to claim 6, wherein forming the cutting trenches and the opening on the second surface of the wafer comprises:

forming, pre-cutting trenches and the opening on the second surface of the wafer in a same etching process; and cutting, along the pre-cutting trenches with a cutter, through the first surface of the wafer to form the cutting trenches.

8. The image sensing chip packaging method according to claim 1, wherein forming the cutting trenches and the opening on the second surface of the wafer comprises:

forming, pre-cutting trenches and the opening on the second surface of the wafer in a same etching process; and cutting, along the pre-cutting trenches with a cutter, through the first surface of the wafer to form the cutting trenches.

9. The image sensing chip packaging method according to claim 1, wherein before applying the second photosensitive ink, the image sensing chip packaging method further comprises:

forming an insulating layer on a sidewall of the opening;

forming a rewiring layer on the insulating layer and at the bottom of the opening, wherein the rewiring layer is electrically connected to the contact pad;

applying the second photosensitive ink on the second surface of the wafer by a screen-printing process to form a plurality of through holes on the second photosensitive ink, wherein the rewiring layer is exposed through the through holes; and forming a solder ball in each of the through holes, wherein the solder ball is electrically connected to the rewiring layer.

10. The image sensing chip packaging method according to claim 1, wherein before applying the second photosensitive ink, the image sensing chip packaging method further comprises:

forming an insulating layer on a sidewall of the opening;

forming a rewiring layer on the insulating layer and at the bottom of the opening, wherein the rewiring layer is electrically connected to the contact pad;

applying the second photosensitive ink on the entire second surface of the wafer by a spin-coating process;

forming a plurality of through holes on the second photosensitive ink by an exposing and developing process, wherein the rewiring layer is exposed through the through holes; and forming a solder ball in each of the through holes, wherein the solder ball is electrically connected to the rewiring layer.

11. An image sensing chip package, comprising:

a substrate comprising a first surface and a second surface opposite to the first surface;

an image sensing region and contact pads, arranged on the first surface of the substrate;

openings arranged on the second surface and extending towards the first surface, wherein each of the contact pads corresponds to one of the openings and is exposed through the opening;

a first photosensitive ink covering a sidewall of the substrate; and a second photosensitive ink covering the openings and forming a hollow cavity in each of the openings.

12. The image sensing chip package according to claim 11, further comprising:

a protective substrate aligned and laminated with the first surface of the substrate; and a support unit arranged between the protective substrate and the substrate, and enclosing the image sensing region; wherein the first photosensitive ink covers a portion of a sidewall of the support unit.

13. The image sensing chip package according to claim 11, wherein a viscosity of the first photosensitive ink is less than a viscosity of the second photosensitive ink.

14. The image sensing chip package according to claim 13, wherein the viscosity of the first photosensitive ink is less than 8 Kcps, and the viscosity of the second photosensitive ink is greater than 12 Kcps.

15. The image sensing chip package according to claim 11, further comprising:

an insulating layer arranged on a sidewall of each of the openings; and a rewiring layer on the insulating layer and at the bottom of the opening, wherein the rewiring layer is electrically connected to the contact pad, wherein the second photosensitive ink covers the rewiring layer and is provided with through holes through which the rewiring layer is exposed; and a solder ball is arranged in each of the through holes and is electrically connected to the rewiring layer.

* * * * *